US012643301B2

(12) United States Patent
Lin et al.

(10) Patent No.: US 12,643,301 B2
(45) Date of Patent: Jun. 2, 2026

(54) BONDING MACHINE WITH HORIZONTAL CORRECTION FUNCTION AND HORIZONTAL CORRECTION METHOD THEREOF

(71) Applicant: SKY TECH INC., Hsinchu County (TW)

(72) Inventors: Jing-Cheng Lin, Hsinchu County (TW); Jung-Hua Chang, Hsinchu County (TW); Mao-Chan Chang, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 1028 days.

(21) Appl. No.: 17/824,699

(22) Filed: May 25, 2022

(65) Prior Publication Data

US 2023/0382071 A1 Nov. 30, 2023

(51) Int. Cl.
| | |
|---|---|
| *B30B 15/00* | (2006.01) |
| *B30B 15/14* | (2006.01) |
| *F16B 11/00* | (2006.01) |
| *H01L 21/67* | (2006.01) |
| *H10P 72/00* | (2026.01) |

(52) U.S. Cl.
CPC ........ *B30B 15/0041* (2013.01); *B30B 15/148* (2013.01); *F16B 11/002* (2013.01); *H10P 72/0428* (2026.01)

(58) Field of Classification Search
CPC . B30B 15/0041; B30B 15/148; F16B 11/002; H01L 21/67092
See application file for complete search history.

(56) References Cited

U.S. PATENT DOCUMENTS

| | | | | |
|---|---|---|---|---|
| 5,895,444 A | * | 4/1999 | Ruck ................... | G05B 19/401 |
| | | | | 33/503 |
| 2022/0277979 A1 | * | 9/2022 | Yamasaki ............. | H01L 21/681 |

OTHER PUBLICATIONS

Santop Seal—"What are the Benefits of Using Rubber Seals & Gaskets?". Dated Apr. 6, 2022 as per p. 2 para. 1. Webpage accessed at <https://www.santopseal.com/what-are-the-benefits-of-using-rubber-seals-gaskets/> (Year: 2022).*

* cited by examiner

*Primary Examiner* — Alex B Efta
*Assistant Examiner* — Alexander S Wright
(74) *Attorney, Agent, or Firm* — Chun-Ming Shih; HDLS IPR SERVICES

(57) ABSTRACT

A bonding machine with horizontal correction function includes a first chamber, a second chamber, a pressing unit, a carrier, a plurality of level adjustment units, and a plurality of distance measuring units. The first chamber is configured to be connected to the second chamber to define an enclosed space therebetween. The pressing unit is disposed within the first chamber, and the carrier is disposed within the second chamber. The pressing unit faces the carrier and is configured to press the substrates placed on the carrier. The leveling units are disposed on the first chamber, and the distance measuring units are disposed on the second chamber. Each distance measuring unit is configured to project a detecting beam onto the pressing unit, to measure the level of the pressing unit so as to adjust the level of the pressing unit through the level adjustment unit.

19 Claims, 11 Drawing Sheets

BONDING MACHINE WITH HORIZONTAL CORRECTION FUNCTION AND HORIZONTAL CORRECTION METHOD THEREOF

BACKGROUND

Technical Field

This disclosure relates to a bonding machine with horizontal correction function, which is able to measure the level of the pressing unit, and adjust the level of the pressing unit.

Related Art

The integrated circuit technology has been well developed. At present, electronic products are developing towards the trend of being light and thin, and having high performance, high reliability and intelligence. The chip in an electronic product can have a significant impact on the performance of the electronic product, wherein the performance is partly related to the thickness of the chip. For example, thinner chips can improve heat dissipation efficiency, increase mechanical performance, improve electrical properties, and reduce package size and weight.

In the semiconductor process, the substrate thinning process, the via etching process, and the backside metallization process are usually performed on the backside (i.e., lower surface) of the wafer. However during the substrate thinning process, if the thickness of the substrate is too thin (e.g., less than or equal to 150 microns), it may cause wafer breakage or deformation of the wafer, thereby rendering the wafer unusable and reducing wafer yield.

Therefore, a bonding process is performed before the substrate thinning process. The bonding process mainly arranges a bonding layer between the wafer and the carrier layer (e.g., sapphire crystal layer), and presses the stacked wafer and carrier layer by using a pressing unit and a carrier, so as to bonding the wafer and the carrier layer. After the substrate thinning process, a debonding process is performed, to separate the wafer and the carrier body.

However, if the bonding machine fails to keep the pressing unit and the carrier in parallel during the bonding process, it may cause uneven pressing force of the pressing unit and the carrier on the wafer and the carrier. As a result, bonding bubbles may occur in the bonding layer between the substrate and the carrier, and the total thickness variation (TTV) of the bonded wafer is poor.

SUMMARY

To solve the above-mentioned problem, this disclosure provides a bonding machine with horizontal correction function, which is able to measure the level of the pressing unit by using distance measuring units, and to adjust the level of the pressing unit according to the measurement. Therefore, the pressing unit and the carrier are kept in parallel continuously, and a uniform pressing force is applied to the first substrate and the second substrate therebetween, so as to avoid bonding bubbles between the first substrate and the second substrate.

An object of this disclosure is to provide a bonding machine with horizontal correction function. The bonding machine includes a first chamber, a second chamber, a pressing unit, a carrier, a plurality of level adjustment units, and a plurality of distance measuring units. The first chamber is configured to be connected to the second chamber to define an enclosed space therebetween.

The pressing unit is connected to the first chamber, and the carrier is connected to the second chamber. A carrying surface of the carrier is configured to carry a first substrate and a second substrate stacked on the carrying surface, and the pressing unit faces the carrier. The pressing unit is configured to move with respect to the carrier, and configured to press the first substrate and the second substrate on the carrier, so as to form a bonded substrate.

The distance measuring units are disposed on the second chamber, and respectively project a detecting beam onto the pressing unit. In one embodiment, the number of the distance measuring units can be three, and this three the distance measuring units are configured to measure the distances of three non-collinear points on the pressing unit. According to the distance difference between the three distance measuring units and the three non-collinear points on the pressing unit, the level of the pressing unit can be determined.

The level adjustment units pass through the first chamber. One end of each level adjustment unit is connected to the pressing unit, and the other end is located outside the first chamber and the enclosed space. When the pressing unit is not in parallel to the carrier, it is able to adjust the level of the pressing unit through the level adjustment unit outside the enclosed space, so as to adjust the pressing unit to be in parallel to the carrier.

Specifically, in this disclosure, it is able to determine whether the pressing unit is kept in parallel to the carrier according to the measurement result of the distance measuring units, and to adjust the level of the pressing unit in real time by the level adjustment unit. During measuring and adjusting the level of the pressing unit, the enclosed space between the first chamber and the second chamber can maintain in low pressure or vacuum state, to improve the accuracy of measuring and adjusting the level of the pressing unit.

An object of this disclosure is to provide a horizontal correction method for a bonding machine, which is able to release the level adjustment units connected to the pressing unit in a low pressure or vacuum environment, to make the pressing unit completely fit the carrying surface of the carrier. The method utilizes the three distance measuring units to measure the distances with the pressing unit, to zero the three distance measuring units and tighten the level adjustment unit to fix the position of the pressing unit.

Then the three distance measuring units can regularly measure the distances to the pressing unit, to determine whether the pressing unit maintains in parallel to the carrier according the difference of the distance measured. If the pressing unit is not in parallel to the carrier, the level adjustment units connected to the pressing unit are released again, and then the pressing unit will completely fit the carrying surface of the carrier, so that the pressing unit is in parallel to the carrying surface of the carrier.

Through the horizontal correction method of this disclosure, it is able to continuously measure whether the pressing unit maintains in parallel to the carrier during the bonding process. When the pressing unit is not in parallel to the carrier, it is able to adjust by using the level adjustment unit, so as to effectively prevent bonding bubbles from occurring between the first substrate and the second substrate.

To achieve the object, this disclosure provides a bonding machine with horizontal correction function, includes: a first chamber; a second chamber facing the first chamber, wherein the first chamber is configured to be connected to the second chamber to define an enclosed space between the first chamber and the second chamber; a pressing unit connected to the first chamber; a carrier connected to the second chamber and including a carry surface facing the pressing unit, wherein the carrying surface is configured to carry a first substrate and a second substrate stacked on the carrying surface; a plurality of level adjustment units disposed on the first chamber and including an adjusting bar; wherein the adjusting bar passes through the first chamber and connected to the pressing unit, and a part of the adjusting bar is located outside the enclosed space to form an adjusting part on the first chamber; and a plurality of distance measuring units disposed on the second chamber to project detecting beams onto the pressing unit, to measure distances between the pressing unit and each of the distance measuring units.

This disclosure provides a horizontal correction method for a bonding machine, including: connecting a first chamber to a second chamber to define an enclosed space between the first chamber and the second chamber; extracting air within the enclosed space to have the enclosed space in a low pressure or vacuum state; releasing a plurality of level adjustment units to make the pressing unit fit the carrying surface of the carrier; detecting distances between a plurality of distance measuring unit and the pressing unit, and then reset the distance measuring units to zero; tightening the plurality of level adjustment units to fix the position of the pressing unit; and detecting distances between a plurality of distance measuring unit and the pressing unit, to determine whether the pressing unit maintains in parallel to the carrier.

In at least one embodiment, the level adjustment unit includes a suspension rod and the suspension rod is connected to the pressing unit.

In at least one embodiment, the level adjustment unit includes a case body fixed to the first chamber, the adjusting bar and the suspension rod pass through the case body and the first chamber to connect with the pressing unit, and the adjusting bar and the suspension rod are respectively connected to the case body via a shaft seal.

In at least one embodiment, the adjusting bar includes a connection portion, a first elastic portion and a first sleeve, the connection portion has an end connected to the pressing unit and another end connected to the connection portion via the first elastic portion, the first sleeve is sleeved over the first elastic portion, and an end of the first sleeve is connected to the pressing unit.

In at least one embodiment, each of the distance measuring units is a laser distance meter.

In at least one embodiment, and the number of the distance measuring units is three or more.

In at least one embodiment, the bonding machine further includes a pressing unit driver connected to the pressing unit, configured to drive the pressing unit to move toward or to move away from the carrier, so as to press the first substrate and the second substrate on the carrier.

In at least one embodiment, the plurality of distance measuring units are located around the carrier.

In at least one embodiment, the pressing unit includes a plurality of reflection portions corresponding to the plurality of distance measuring units, and the distance measuring units respectively project the detecting beams onto the plurality of reflection portions.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
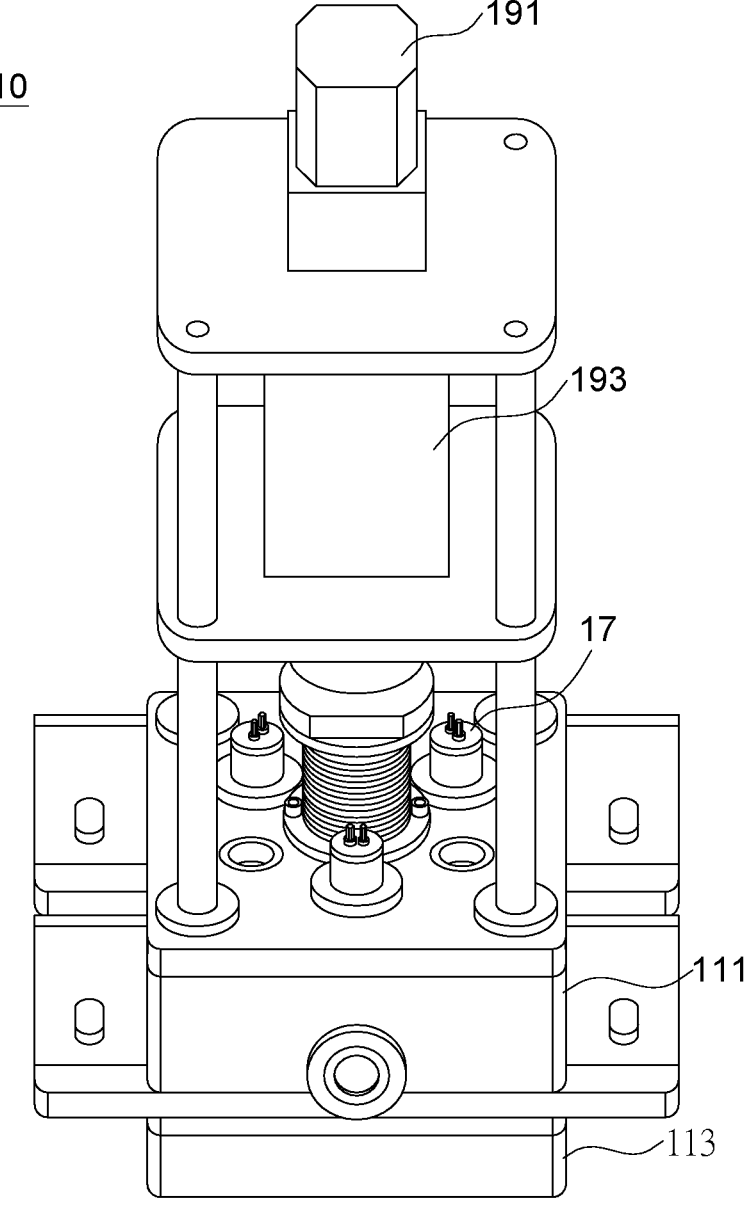
FIG. 1 is a three-dimensional view of a bonding machine with horizontal correction function according to an embodiment of this disclosure.
Figure 2:
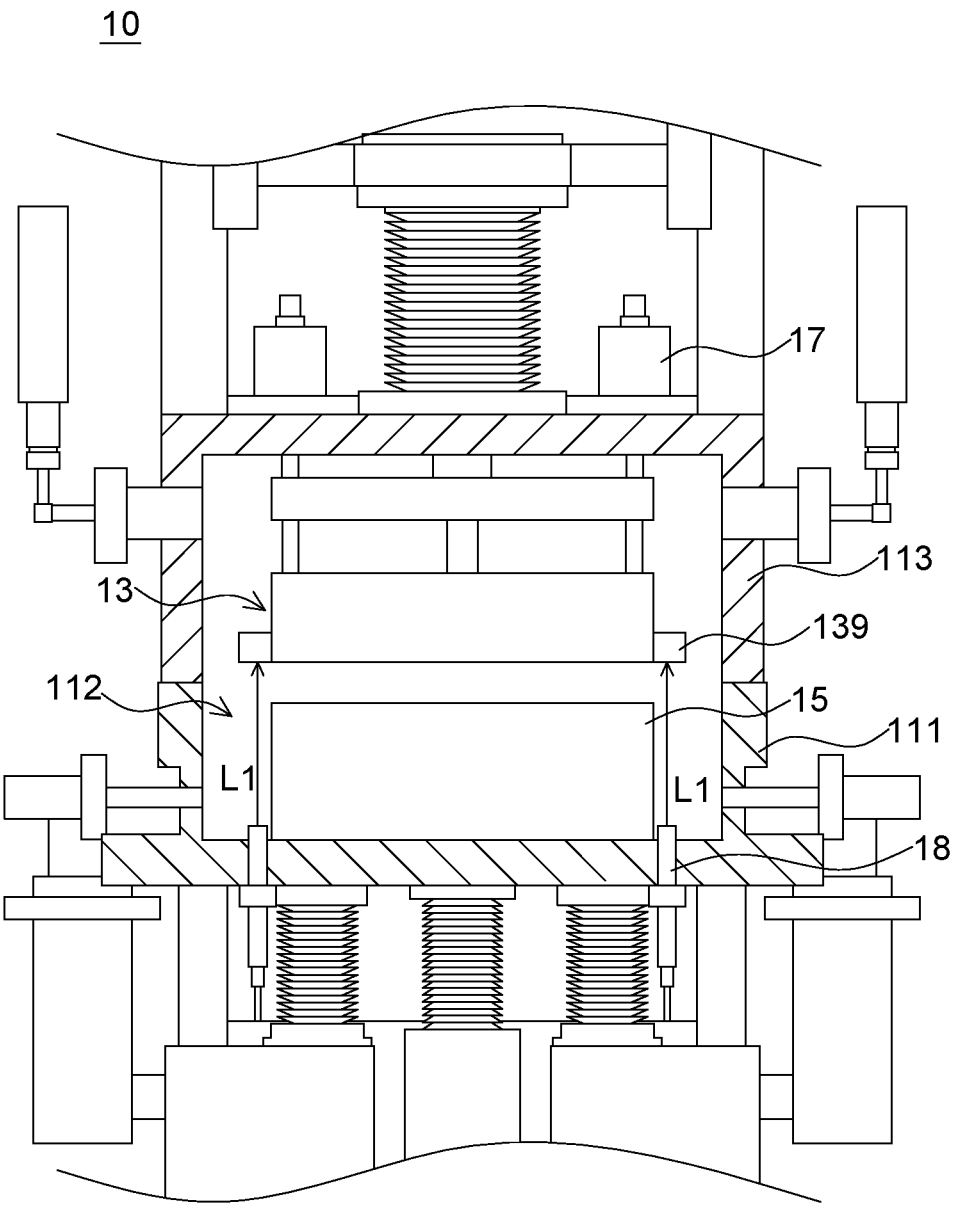
FIG. 2 is a cross-sectional view of the bonding machine with horizontal correction function according to the embodiment of this disclosure.

FIG. 1 and FIG. 2 are three-dimensional view and cross-sectional view of a bonding machine with horizontal correction function according to an embodiment of this disclosure. As shown in drawings, the bonding machine 10 with horizontal correction function includes a first chamber 111, a second chamber 113, a pressing unit 13, a carrier 15, a plurality of level adjustment units 17 and a plurality of distance measuring units 18. The first chamber 111 faces the second chamber 113, and the first chamber 111 is configured to move with respect to the second chamber 113.

As shown in FIG. 2, the pressing unit 13 is disposed within the first chamber 111 and connected to the first chamber 111. The carrier 15 is located within the second chamber 113 and connected to the second chamber 113. A carrying surface 151 faces the pressing unit 13. After the first chamber 111 is connected to the second chamber 113, an enclosed space 112 is defined therebetween, and the pressing unit 13 and the carrier 15 are located within the enclosed space 112.

As shown in FIG. 1, in at least one embodiment of this disclosure, the first chamber 111 is connected to a chamber driver 191. The chamber driver 191 is located outside the enclosed space 112 and connected to the first chamber 111. The chamber driver 191 is configured to drive the first chamber 111 to move with respect to the second chamber 113. In an example, the chamber driver 191 is a linear actuator.

Moreover, a pressing unit driver 193 is disposed outside the enclosed space 112 and connected to the pressing unit 13. In an example, the pressing unit driver 193 is a linear actuator configured to drive the pressing unit 13 to move toward or to move away from the carrier 15. After aligning a first substrate 121 with a second substrate 123, the pressing unit driver 193 drives the pressing unit 13 to move toward the carrying surface 151 of the carrier 15 to press the first substrate 121 and the second substrate 123 on the carrier 15 so as to bond the first substrate 121 and the second substrate 123.

Figure 3:
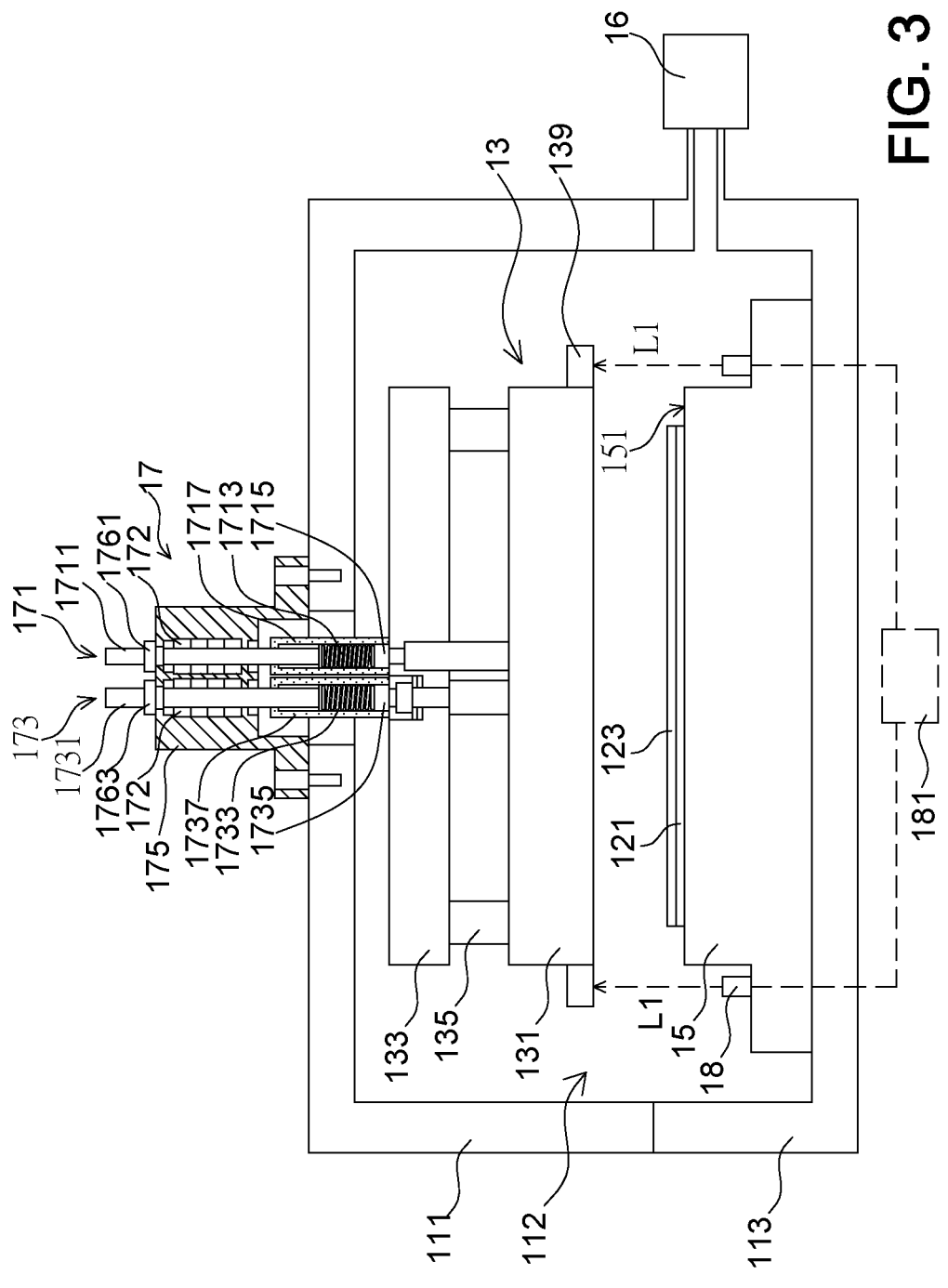
FIG. 3 is a partial cross-sectional view of the bonding machine with horizontal correction function according to the embodiment of this disclosure.

As shown in FIG. 3, in one embodiment an air extraction pump 16 is disposed to the first chamber 111 or the second chamber 113. The air extraction pump 16 is fluidly connected to the enclosed space 112 and configured to extract air within the enclosed space, to reduce pressure in the enclosed space 112, so as to have the enclosed space 112 in a low pressure or vacuum state.

The carrying surface 151 of the carrier 15 is configured to carry the first substrate 121 and the second substrate 123 stacked on the carrying surface. In an example the first substrate 121 is a carrier substrate, the second substrate is a wafer, and an adhesive layer is provided between the first substrate 121 and the second substrate 123 to bond the first substrate 121 and the second substrate 123. In another example, the first substrate 121 and the second substrate 123 are wafers that have undergone a semiconductor process.

As shown in FIG. 1, the pressing unit driver 193 is disposed outside the enclosed space 112 and connected to the pressing unit 13. In an example, the pressing unit driver 193 is a linear actuator After aligning a first substrate 121 with a second substrate 123, the pressing unit driver 193 drives the pressing unit 13 to move toward the carrying surface 151 of the carrier 15 to press the first substrate 121 and the second substrate 123 on the carrier 15 so as to bond the first substrate 121 and the second substrate 123.

As shown in FIG. 3, the pressing unit 13 includes a pressing plate 131, a connecting plate 133 and a plurality of fixing rods 135. The connecting plate 133 is connected to the pressing plate 131 through the fixing rods 135. The pressing plate 131 faces the carrying surface 151 of the carrier 15 and configured to press the first substrate 121 and the second substrate 123 on the carrier 15. The pressing unit 13 including the pressing plate 131, the connecting plate 133 and the fixing rods 135 is merely an example of this disclosure not a restrict limitation.

In at least one embodiment of this disclosure, a first heating unit 153 is disposed within the carrier 15, and a second heating unit 132 is disposed within the pressing unit 132. During bonding, the first heating unit 153 and the second heating unit 132 are able to heat the first substrate 121, the second substrate 123 and the adhesive layer between the pressing unit 13 and the carrier 15.

The adjustment units 17 are disposed on the first chamber 111. Each level adjustment unit 17 passes through the first chamber 111 and connected to the pressing unit 13 in the enclosed space 112. Each level adjustment unit 171 includes an adjusting bar 171. The adjusting bar 171 passes through the first chamber 111 and connected to the pressing unit 13.

The adjusting bar 171 includes an adjusting part 1711 and a connection portion 1715. A part of the adjusting bar 171 is disposed on the first chamber 111 and located outside the enclosed space 112, to form the adjusting part 1711 on the first chamber 111. The part of the adjusting bar 171 located within the enclosed space 112 forms the connection portion 1715 and configured to connect with the pressing unit 13. In an example, plural screw holes are provided on the surface of the connecting plate 133 of the pressing unit 13 that facing the first chamber 111 and the connection portion 1715 is provided a screw bar for screwed into a corresponding screw hole of the pressing unit 13. When a user rotates the exposed adjusting bar 171, the connection portion 1715 rotates with respect to the pressing unit 13 to change the length of the connection portion 1715 in the screw hole, so as to adjust the level of the pressing unit 13.

In at least one embodiment of this disclosure, the adjusting bar 171 includes a first elastic portion 1713. The connection portion 1715 is connected to the adjusting part 1711 via the first elastic portion 1713. In an example, the first elastic portion 1713 is a spring. When the length of the connection portion 1715 in the screw hole increases, the pressing unit 13 moves toward the first chamber 111 (to move upward in the drawings) and compresses the first elastic portion 1713. When the length of the connection portion 1715 in the screw hole decreases, the pressing unit 13 moves away from the first chamber 111 (to move downward in the drawings), the first elastic portion 1713 recovers and elongates. Moreover, a first sleeve 1717 is sleeved over the first elastic portion 1713. One end of the first sleeve 1717 is connected to or fixed on the pressing unit 13 to move upward or downward along with the pressing unit 13.

In at least one embodiment of this disclosure, the level adjustment unit 17 includes a suspension rod 173. The suspension rod 173 passes through the first chamber 111 and connected to the pressing unit 13. The suspension rod 173 is similar to the adjusting bar 171 and includes a fixed end 1731 and a connecting end 1735. A part of the suspension rod 173 located outside the first chamber 111 and the enclosed space 112 forms the fixed end 1731; and a part of the suspension rod 173 located inside the enclosed space 112 forms the connecting end 1735 that is configured to connect with the pressing unit 13. In addition, a second elastic portion 1733 is further disposed between the fixed end 1731 and the connecting end 1735, and a second sleeve 1737 is sleeved over the second elastic portion 1733. One end of the second sleeve 1737 is connected to or fixed on the pressing unit 13.

When the user adjusts the level of the pressing unit 13 through the adjusting bar 171, the second elastic portion 1733 of the suspension rod 173 is also compressed or elongated, and the second sleeve 1737 moves upward or downward along with the pressing unit 13. In one embodiment or some embodiments of this disclosure, the connecting end 1735 of the suspension rod 173 is fixed to the pressing unit 13, such that the suspension rod 173 is not allowed to rotate with respect to the pressing unit 13. In another example, the suspension rod 173 is allowed to rotate with respect to the pressing unit 13.

Furthermore, each level adjustment unit 171 includes a case body 175 connected to and fixed on the first chamber 111. The adjusting bar 171 and/or the suspension rod 173 pass through the case body 175 and the first chamber 111, and is fixed on the case body 175, so as to be connected to the pressing unit 13. For example, the adjusting bar 171 and/or the suspension rod 173 is connected to the case body 175 through a shaft seal 172 and/or at least one bearing, such that the adjusting bar 171 and/or the suspension rod 173 is allowed to rotate with respect to the case body 175 and the first chamber 111, and keep the enclosed space 112 in a low pressure or vacuum state.

Specifically, the adjusting part 1711 of the adjusting bar is connected to the case body 175 via a first fixing unit 1761, and the fixed end 1731 of the suspension rod 173 is connected to the case body 175 via a second fixing unit 1763. Under such circumstance the adjusting bar 171 and/or the suspension rod 173 are not allowed to rotate with respect to the case body 175 and/or the first chamber 111, so as to fix the altitude and level of the pressing unit 13. In an example the first fixing unit 1761 and the second fixing unit 1763 are screw nuts.

As shown in FIG. 2 and FIG. 3, the plurality of distance measuring units 18 are disposed on the second chamber 113 and face the pressing unit 13. Each distance measuring unit 18 project a detecting beam L1 onto the pressing unit 13 to measure distances between the pressing unit 13 and each of the distance measuring units 18.

In an example of this disclosure, each of the distance measuring unit 18 is a laser distance meter, and preferably a high precision laser distance meter, such as a laser distance meter using the principle of triangulation.

Figure 4:
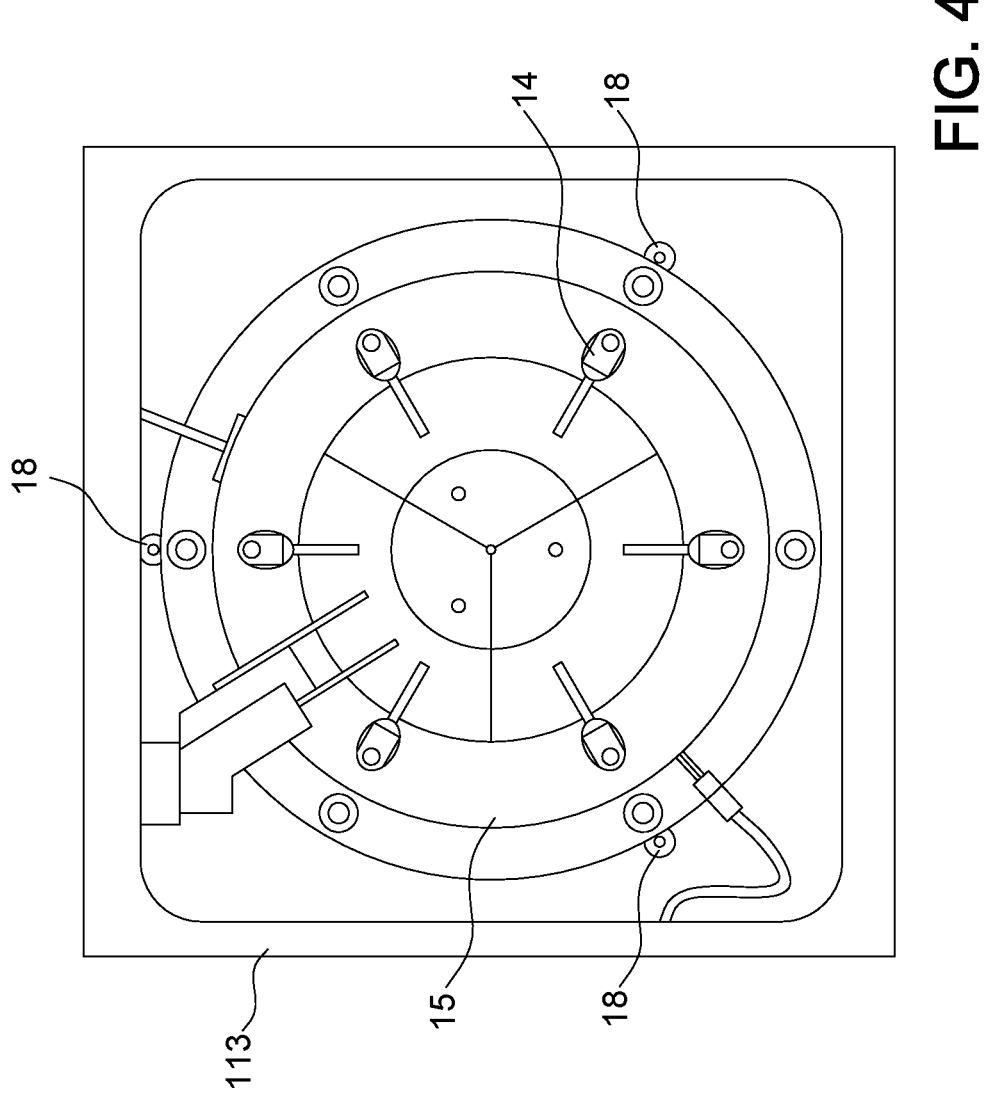
FIG. 4 a cross-sectional view of a bonding machine with horizontal correction function according to another embodiment of this disclosure.
Figure 5:
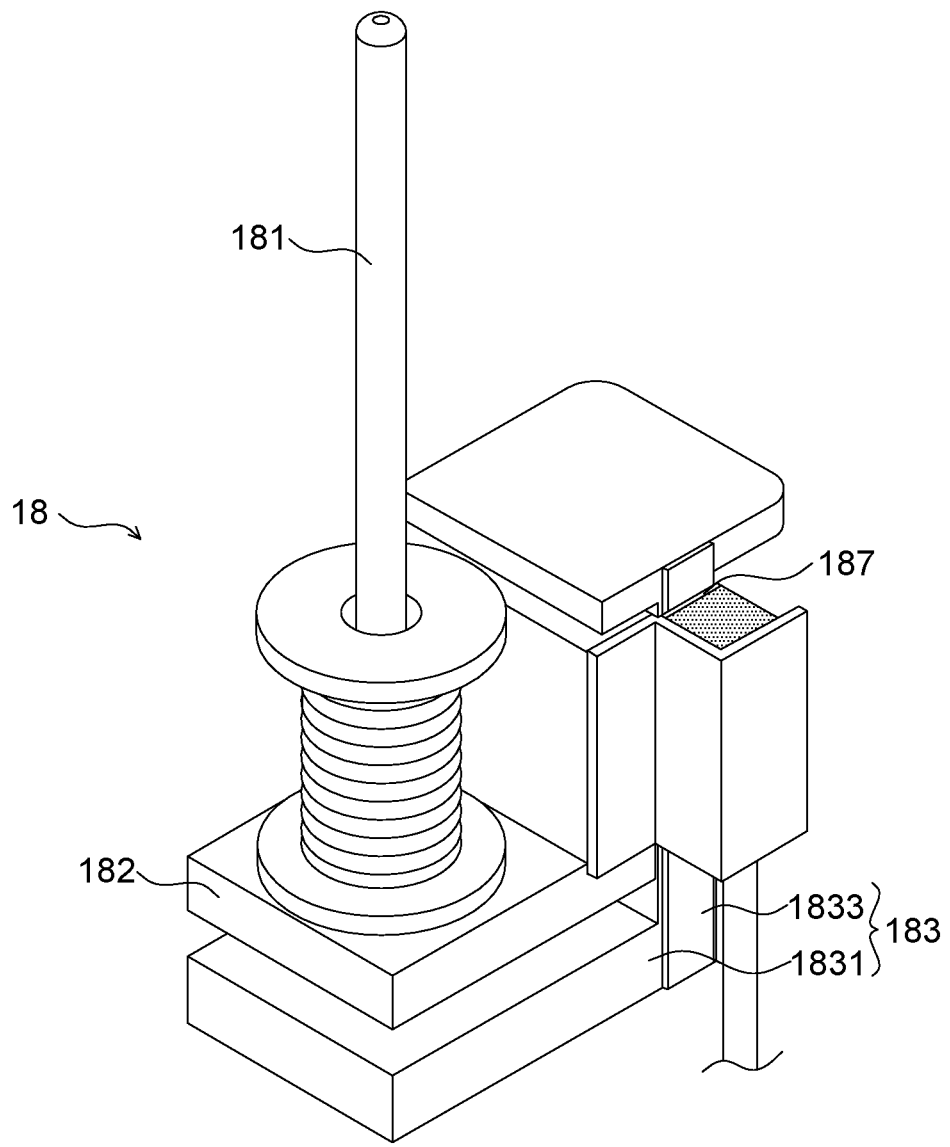
FIG. 5 is a three-dimensional view of distance measuring units of the bonding machine with horizontal correction function according to the embodiment of this disclosure.
Figure 6:
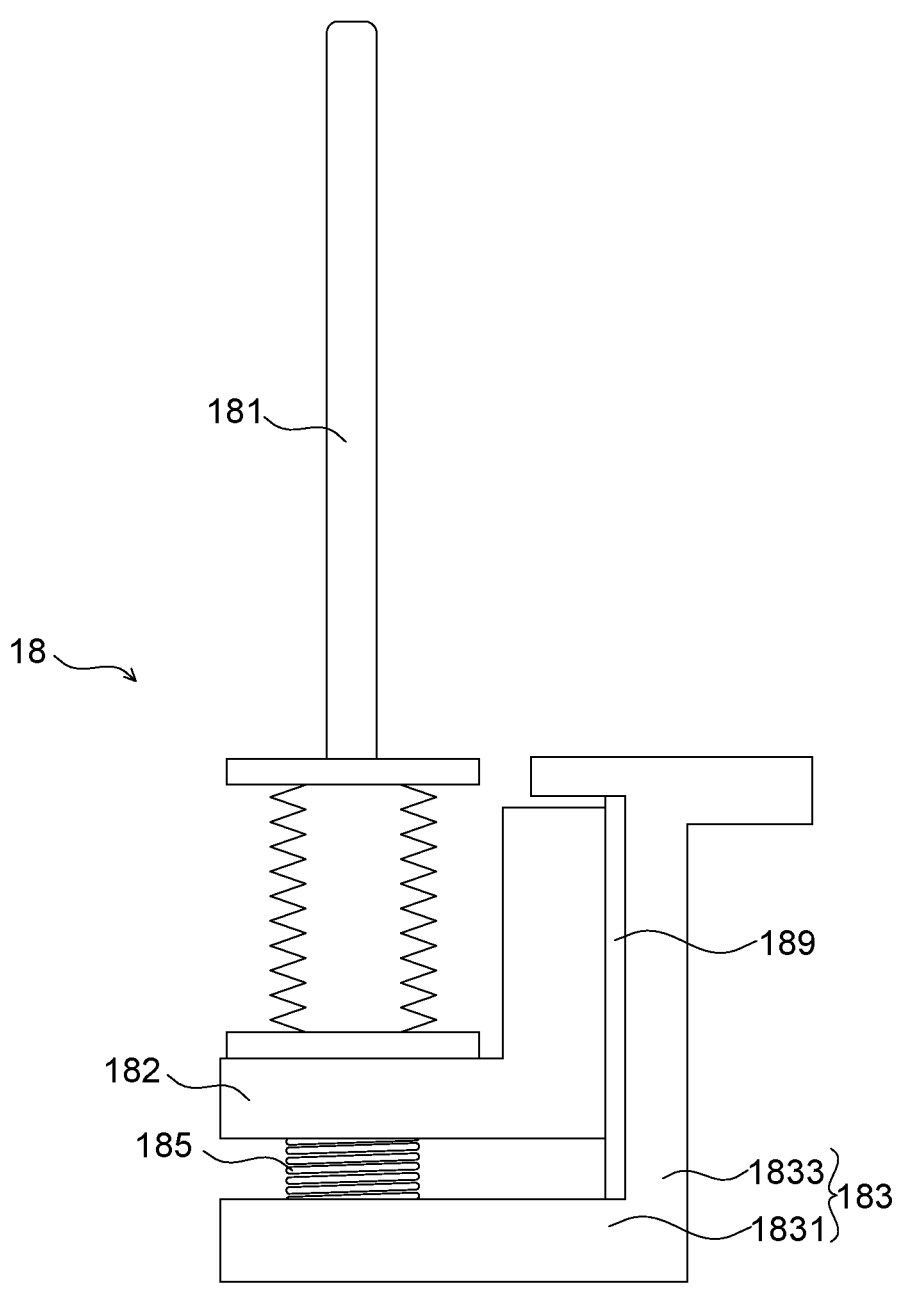
FIG. 6 is a side view of the distance measuring units of the bonding machine with horizontal correction function according to the embodiment of this disclosure.

As shown in FIG. 4, FIG. 5, and FIG. 6, the plurality of distance measuring units 18 are disposed on the second chamber 113 and face the pressing unit 13. Each distance measuring unit 18 includes a pin body 181, a connection seat 182, a fixing seat 183 and an elastic member 185. The pin body 181 is disposed on the connection seat 182 and faces the pressing unit 13. The pin body 181 is disposed higher than the carrying surface 151 of the carrier 15. The connection seat 182 is connected to the pin body, and is disposed on the fixing seat 183 through a rail 189. The connection seat 182 is connected to the fixing seat 183 via the elastic member 185, such that the pin body 181 and the connection seat 182 are allowed to move with respect to the fixing seat 183 along the rail 189 and compress the elastic member 185.

As shown in FIG. 5 and FIG. 6, in at least one embodiment of this disclosure, the fixing seat 183 includes a bottom 1831 and a lateral portion 1833. In an example, the bottom 1831 and lateral portion 1833 are both plates, and an included angle therebetween is about 90 degrees. The rail 189 is disposed on the lateral portion 1833 of the fixing seat 183, and the connection seat 182 is connected to the lateral portion 1833 of the fixing seat 183, such that the pin body 181 and the connection seat 182 are allowed to move with respect to the fixing seat 183 along the rail 189.

The elastic member 185 is disposed between the connection seat 182 and the bottom 1831 of the fixing seat 183. When the pin body 181 and the connection seat 182 move with respect to the fixing seat 183 along the rail 189, for example the pin body 181 sustains a downward force; the connection seat 182 and the bottom 1831 of fixing seat 183 compress the elastic member 185 therebetween. When the downward force on the pin body 181 stops, the elastic member 185 recovers and elongates, such that the pin body 181 returns to its original height that the pin body 181 does not sustain the downward force.

In at least one embodiment of this disclosure, scale marks are provided on the lateral portion 1833 of the fixing seat 183. When the pin body 181 and the connection seat 182 move with respect to the fixing seat 183, displacement of the pin body 181 along with the connection seat 182 is able to be obtained by using the scale marks.

In at least one embodiment of this disclosure, a linear optical scale 187 is disposed on the fixing seat 183 and/or the connection seat 182. The linear optical scale 187 is sued to measure the displacement of the pin body 181 and the connection seat 182 relative to the fixing seat 183. The linear optical scale 187 is a common distance/length measuring device, which usually includes a main scale, a secondary scale, and a light sensor. The linear optical scale 187 is a device well known to person having ordinary skill in the art, and details are not described herein again. In another example, the linear optical scale 187 is alerted by a linear magnetic scale.

Figure 7:
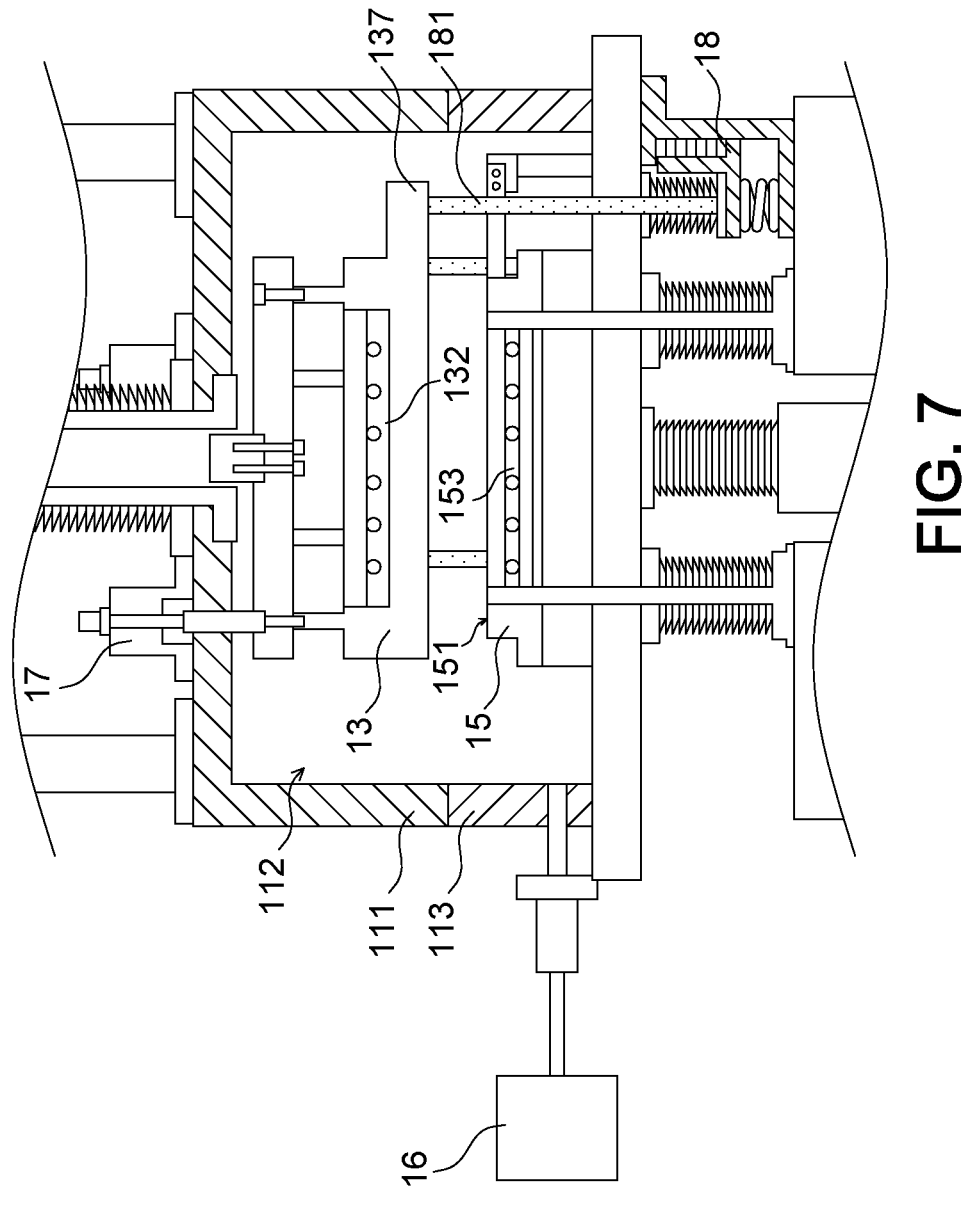
FIG. 7 is a top view of a carrier and distance measuring units of the bonding machine with horizontal correction function according to the embodiment of this disclosure.

As shown in FIG. 7, the number of the distance measuring units 18 is three or more. And the distance measuring units 18 are located around the carrier 15. For explanation, in the embodiments of this disclosure three distance measuring units 18 are used for description, and in practical applications the number of distance measuring units 18 can greater than three. The three distance measuring units 18 of this disclosure are not colinear, and the detecting beams L1 are projected on three non-colinear measuring points on the pressing unit 13 or the pressing plate 131.

Furthermore, in at least one embodiment of this disclosure, a plurality of alignment units 14 are provided on the carrying surface 151 of the carrier 15, the alignment units 14 are configured to move toward or away from the first substrate 121 and the second substrate 123 on the carrier 15, to have the second substrate 123 be aligned with the first substrate 121.

In at least one embodiment of this disclosure, the three distance measuring units 18 are arranged around the stage 15 in an equidistant manner. It is only an embodiment of this disclosure that the three distance measuring units 18 are arranged in an equidistant manner. In different embodiments, the three distance measuring units 18 can be arranged around the stage 15 in an unequal distance.

When the pressing unit 13 moves toward the carrier 15, the pressing unit 13 contacts the pin body 181 of each distance measuring unit 18. As the pressing unit 13 continues to move toward the carrier 15, the pressing unit 13 presses the pin body 181 of each distance measuring unit 18, such that the pin body and the connection seat 182 move with respect to the fixing seat 183 and compress the elastic member 185. Through the above method, each of the distance measuring units 18 is able to measure a distance to the pressing unit 13.

Figure 8:
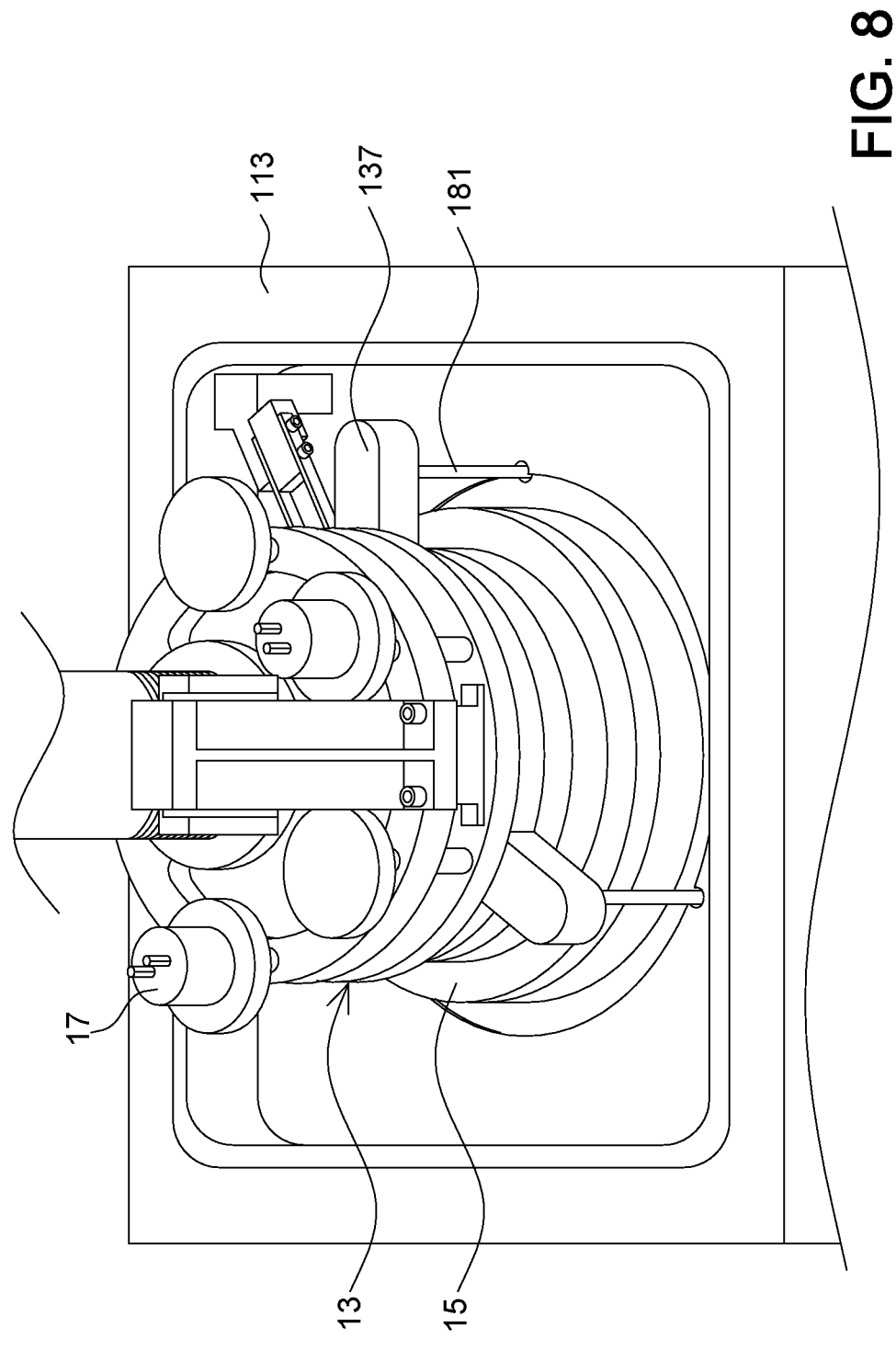
FIG. 8 is a three-dimensional view of a carrier, a pressing unit and the distance measuring units of the bonding machine with horizontal correction function according to an embodiment of this disclosure.

As shown in FIG. 8, the pressing unit 13 includes a plurality of protruding portions 137 corresponding to the plurality of distance measuring units 18. For example, three protruding portions 137 are arranged around the pressing plate 131 and protrude along the radial direction of the pressing plate 131. The three protruding portions 137 are not colinear and respectively provided to correspond one of the three distance measuring units 18. As the pressing unit 13 moves toward the carrier 15, the protruding portions 137 of the pressing unit 13 respectively contact the pin body 181 of each distance measuring unit 18.

Figure 9:
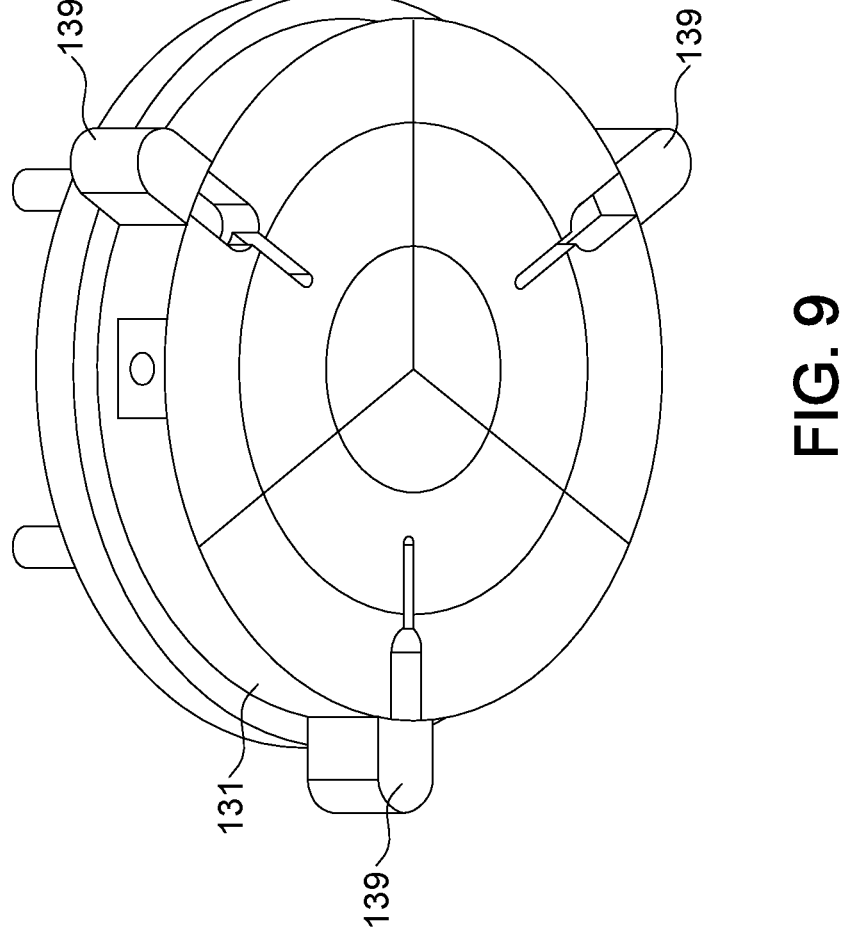
FIG. 9 is a three-dimensional view of a pressing unit of the bonding machine with horizontal correction function according to the embodiment of this disclosure.

As shown in FIG. 2, FIG. 3, and FIG. 9, the pressing unit 13 includes a plurality of reflection portions 137. For example, three reflection portions 139 are arranged around the pressing plate 131 and protrude along the radial direction of the pressing plate 131. The three reflection portions 139 are not colinear and respectively provided to correspond one of the three distance measuring units 18, so as to allow each distance measuring unit 18 to project a detecting beam L1 onto one corresponding reflection portion 139.

Specifically, the three distance measuring units 18 respectively measure distances to the three reflection portion 139 or three designated measuring points. For example, the distances between the pressing unit 13 and the three distance measuring units 18 are measured as a first distance, a second distance and a third distance; if the first distance, the second distance and the third distance are equal, it means the pressing unit 13 is in parallel to the carrier 15. The protruding portions 137 in this disclosure can be canceled, and the three distance measuring unit 18 can directly contact any three non-colinear points on the pressing plate 131.

Similarly, the reflection portions 139 in this disclosure can be canceled, and the three distance measuring unit 18 can directly project detecting beams L1 on any three non-colinear points on the pressing plate 131.

When the any distance difference between the first distance, the second distance and the third distance is greater than a threshold value, it means the pressing unit 13 is not in parallel to the carrier 15. This situation may result in uneven pressing force of the pressing unit 13 and the carrier 15 on the first substrate 121 and the second substrate 123, and the adhesive layer between the first substrate 121 and the second substrate 123 has bonding bubbles.

In at least one embodiment of this disclosure, the plurality of distance measuring units 18 are electrically connected to a processor 181 or a computer. The processor 181 is configured to receive the distances measured by the plurality of distance measuring units 18, and determine whether a distance difference between each of the distances is greater than a threshold value. When any one of distance differences between each of the distances is greater than the threshold value, the processor 181 controls an alarm unit to issue an alarm signal. The warning unit can be a horn or a light-emitting diode, and is configured to generate sound or light to remind the user to adjust the level between the pressing unit 13 and the carrier 15.

Figure 10:
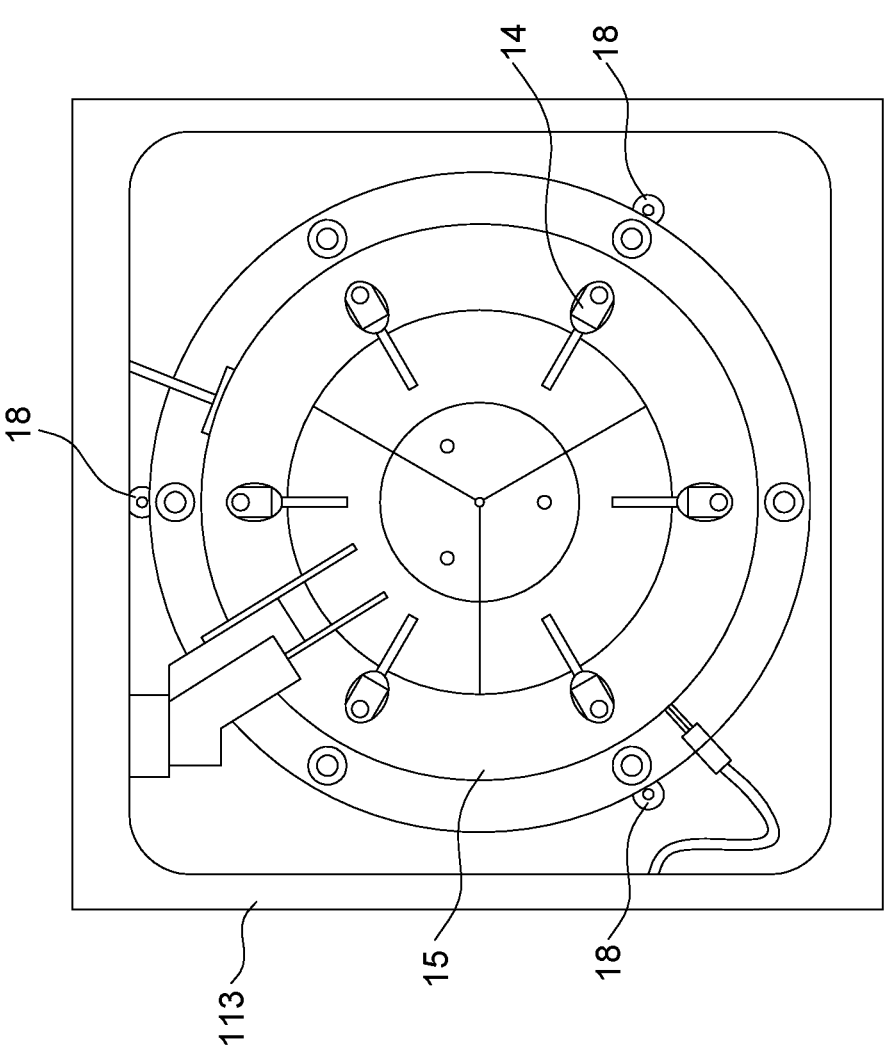
FIG. 10 is a top view of the bonding machine with horizontal correction function according to the embodiment of this disclosure.

Furthermore, as shown in FIG. 10, a plurality of alignment units 14 are provided on the carrying surface 151 of the carrier 15, the alignment units 14 are configured to move toward or away from the first substrate 121 and the second substrate 123 on the carrier 15, to have the second substrate 123 be aligned with the first substrate 121.

In practical application, the bonding machine 10 with horizontal correction function can be calibrated at first. That is, the pressing unit driver 193 is used to move the pressing unit 13 toward the carrier 15, to make the pressing plate 131 of the pressing unit 13 to contact the carrying surface of the carrier 15. And then the level adjustment units 17 are released, For example, the first fixing unit 1761 and the second fixing unit 1763 are released, to make the pressing plate 131 completely fit the carrying surface 151 of the carrier 15.

And then the distance measuring units 18 is used to detect distances between the distance measuring units 18 and the pressing unit 13 and then the distance measuring units 18 are reset to zero. For example, when the pressing unit 13 completely fits the carrying surface 151 of the carrier 15, the distances to the pressing unit 13 measured by the distance measuring units 18 are reset to zero. When the distance measuring units 18 are reset to zero, the level adjustment units 17 are tighten again to fix the position of the pressing unit 13.

After the above processes, the bonding machine with horizontal correction function are reset to zero, and then to bond the first substrate 121 and the second substrate 123. During bonding, the level of the pressing unit 13 is continuously measured by the distance measuring units 18.

Figure 11:
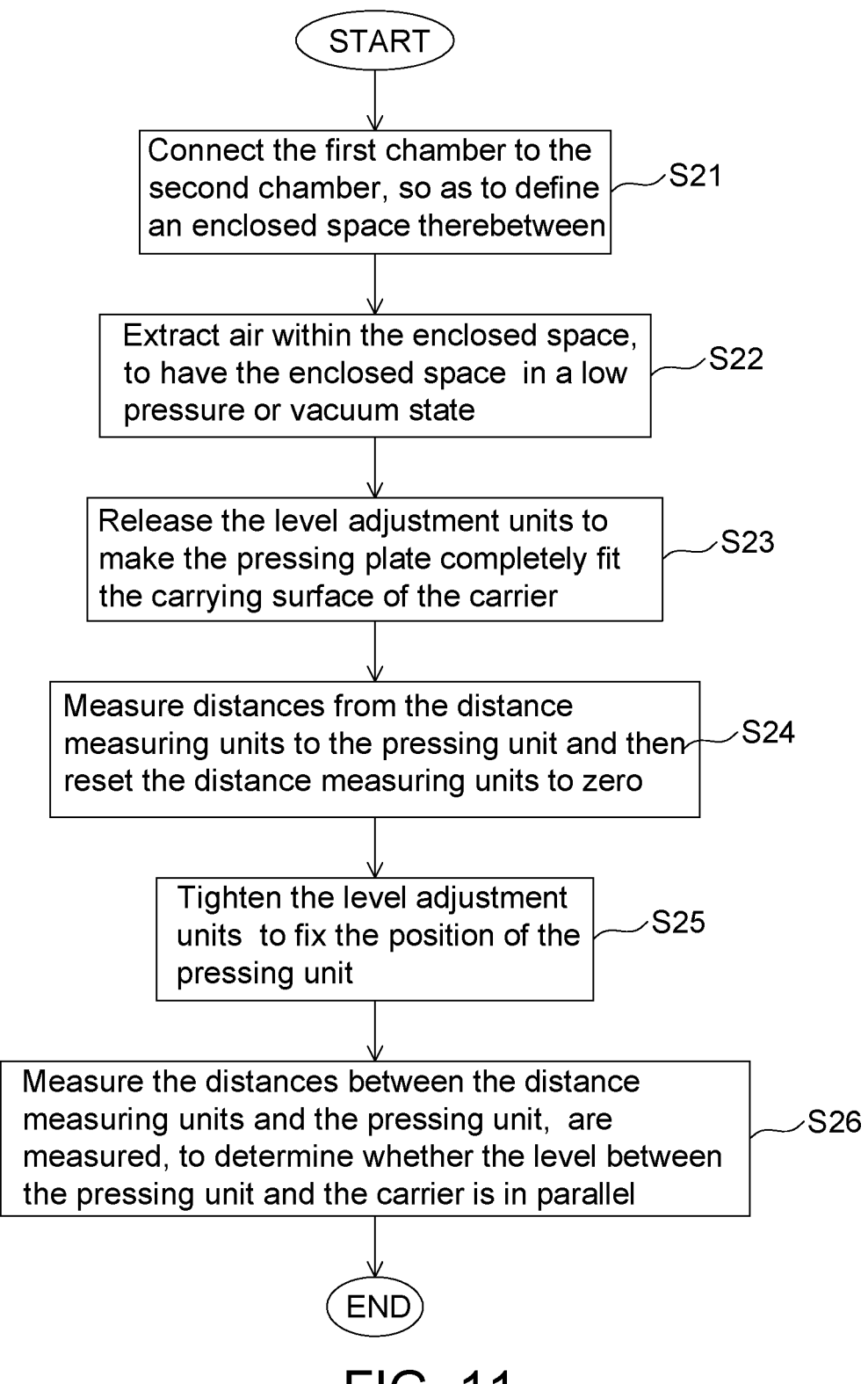
FIG. 11 is a flow chart of a horizontal correction method for the bonding machine according to an embodiment of this disclosure.

As shown in FIG. 11, a horizontal correction method using the bonding machine 10 with horizontal correction function is disclosed. Please refer to FIG. 1 to FIG. 10 together, at first the first chamber 111 is driven by the chamber driver 191 to move toward the second chamber 113, to have the first chamber 111 be connected to the second chamber 113, so as to define an enclosed space 112 between the first chamber 111 and the second chamber 113, as shown in S21.

The air extraction pump 16 is used to extract air within the enclosed space 112, to have the enclosed space 112 in a low pressure or vacuum state, as shown in S22.

The pressing unit driver 193 drives the pressing unit 13 to move towards the carrier 15, to have the pressing plate 131 of the pressing unit 13 contact the carrying surface of the carrier 15. And then the level adjustment units 17 are released, for example, the first fixing unit 1761 and the second fixing unit 1763 are released to make the pressing plate 131 completely fit the carrying surface 151 of the carrier 15, as shown in S23.

When performing the horizontal correction method according to at least one embodiment of this disclosure, the carrying surface 151 of the carrier 15 does not carry any substrate. Therefore, when the level adjustment units 17 connected to the pressing unit 13 are released, the pressing plate 131 of the pressing unit 13 falls down and completely fits the carrying surface 151 of the carrier 15, such that the pressing plate 131 is in parallel to the carry surface 151 of the carrier 15.

In addition, under the circumstance that the enclosed space 112 is in a low pressure or vacuum state, particles or other objects between the pressing plate 131 and the carry surface 151 of the carrier 15 can be avoid, to ensure that the pressing unit 13 completely fit the carry surface of the carrier 15, to improve the precision of the horizontal correction for the pressing unit 13.

The distance measuring units 18 are used to measure distances to the pressing unit 13 and then are reset to zero, as shown in S24. For example, when the pressing unit 13 completely fits the carrying surface 151 of the carrier 15, the distances to the pressing unit 13 measured by the distance measuring units 18 are reset to zero, to complete the zero correction of each distance measuring unit 18.

When the distance measuring units 18 are reset to zero, the level adjustment units 17 are tighten again to fix the position of the pressing unit 13, as shown in S25. In practical application, the order of S24 and S25 can be interchanged, that is the pressing unit 13 is fixed at first and then the distance measuring units 18 are reset to zero.

By S25, the pressing unit 13 is adjusted to be in parallel to the carrier 15. Now, the first substrate 121 and the second substrate 123 can be stacked and placed on the carrying surface 151 of the carrier 15, and then the first substrate 121 and the second substrate 123 are pressed by the pressing unit 13, to bond the first substrate 121 and the second substrate 123.

Specifically, the pressing unit 13 is able to move away from the carrier 15 to a position ready-to-bond. Then the distance measuring units 18 can measure the distances to the pressing unit 13 again, to make sure that the level adjustment units 17 have firmly fixed the pressing unit 13, so that the pressing unit 13 will not be unable to maintain the level or shake due to the upward and downward movement. After the pressing unit 13 has been fixed by the level adjustment units 17, the first substrate 121 and the second substrate 123 can be placed between the pressing unit 13 and the carrier 15 and bonded.

During the bonding process using the bonding machine 10 with horizontal calibration function, the distances between the distance measuring units 18 and the pressing plate 131 of the pressing unit 13 are measured, and the distances can be used to determine whether the level between the pressing unit 13 and the carrier 15 is in parallel, as shown in S26.

In practical application, the distance measuring units 18 can continuously measure the distances to the pressing unit 13, or the distance measuring units 18 can measure the distances to the pressing unit 13 within a fixed time period.

When the difference between the distances measured by any two of the distance measuring units 18 is greater than the threshold value, it means that the pressing unit 13 is not in parallel to the carrier 15, and the level of the pressing unit 13 needs to be adjusted; that S21 to S25 have to be performed again.

The above description is only a preferred embodiment of this disclosure, and is not intended to limit the scope of this disclosure. Modifications should be included within the scope of the patent application of this disclosure.

What is claimed is:

1. A bonding machine with horizontal correction function, comprising:

a first chamber;

a second chamber, facing the first chamber; wherein the first chamber is configured to be connected to the second chamber to define an enclosed space between the first chamber and the second chamber;

a pressing unit, connected to the first chamber and located within the enclosed space;

a carrier, connected to the second chamber, and located within the enclosed space; wherein the carrier includes a carrying surface and the carrying surface is configured to carry a first substrate and a second substrate stacked on the carrying surface;

a plurality of level adjustment units, disposed on the first chamber and including an adjusting bar; wherein the adjusting bar passes through the first chamber and are connected to the pressing unit, a part of the adjusting bar is located outside the enclosed space to form an adjusting part on the first chamber, wherein the level adjustment units include a suspension rod connected to the pressing unit; and a plurality of distance measuring units, disposed on the second chamber and configured to measuring distances between the pressing unit and each of the distance measuring units.

2. The bonding machine with horizontal correction function as claimed in claim 1, wherein the level adjustment units include a case body fixed to the first chamber, the adjusting bar and the suspension rod pass through the case body and the first chamber to connect with the pressing unit, and the adjusting bar and the suspension rod are respectively connected to the case body via a shaft seal.

3. The bonding machine with horizontal correction function as claimed in claim 1, wherein the adjusting bar includes a connection portion, a first elastic portion and a first sleeve, the connection portion has an end connected to the pressing unit and another end connected to the first elastic portion, the first sleeve is sleeved over the first elastic portion, and an end of the first sleeve is connected to the pressing unit.

4. The bonding machine with horizontal correction function as claimed in claim 1, wherein the distance measuring units are configured to project detecting beams onto the pressing unit, to measure distances between the pressing unit and each of the distance measuring units.

5. The bonding machine with horizontal correction function as claimed in claim 4, wherein each of the distance measuring units is a laser distance meter.

6. The bonding machine with horizontal correction function as claimed in claim 4, wherein the pressing unit includes a plurality of reflection portions corresponding to the plurality of distance measuring units, and the distance measuring units respectively project the detecting beams onto the plurality of reflection portions.

7. The bonding machine with horizontal correction function as claimed in claim 1, wherein and the number of the distance measuring units is three or more.

8. The bonding machine with horizontal correction function as claimed in claim 1, further comprising a pressing unit driver connected to the pressing unit, configured to drive the pressing unit to move toward or to move away from the carrier, and to drive the pressing unit to press the first substrate and the second substrate on the carrier.

9. The bonding machine with horizontal correction function as claimed in claim 8, further comprising a chamber driver connected to the first chamber and configured to drive the first chamber to move with respect to the second chamber.

10. The bonding machine with horizontal correction function as claimed in claim 1, wherein the plurality of distance measuring units are located around the carrier.

11. The bonding machine with horizontal correction function as claimed in claim 1, wherein each of the plurality of distance measuring units includes:

a pin body, facing the pressing unit and located higher than the carrying surface of the carrier;

a connection seat, connected to the pin body; and an elastic member, connected to the connection seat; wherein the pressing unit contacts the pin body when moving toward the carrier, such that the pin body and the connection seat move and compress the elastic member, to measure distances between the pressing unit and each of the plurality of distance measuring units.

12. The bonding machine with horizontal correction function as claimed in claim 10, wherein each of the plurality of distance measuring units includes a fixing seat, and the connection seat is connected to the fixing seat via a rail to move with respect to the fixing seat along the rail, so as to compress the elastic member.

13. The bonding machine with horizontal correction function as claimed in claim 12, wherein each of the distance measuring units is a linear optical scale or a linear magnetic scale, and each of the distance measuring units is disposed on the fixing seat to measure distances between the pin body and the fixing seat and between the connection seat and the fixing seat, so as to obtain the distances between the pressing unit and each of the distance measuring units.

14. The bonding machine with horizontal correction function as claimed in claim 13, wherein the fixing seat includes a bottom and lateral portion, the bottom is perpendicular to the lateral portion, the connection seat is connected to the elastic member via the bottom and connected to the lateral portion via the rail.

15. The bonding machine with horizontal correction function as claimed in claim 12, wherein the pressing unit includes a plurality of protruding portions corresponding to the plurality of distance measuring units, and when the pressing unit moves toward the carrier the plurality of protruding portions contact the pin body.

16. The bonding machine with horizontal correction function as claimed in claim 1, further comprising an air extraction pump fluidly connected to the enclosed space and configured to extract air in the enclosed space.

17. The bonding machine with horizontal correction function as claimed in claim 1, further comprising a processor electrically connected to the plurality of distance measuring units, and configured to receive the distances measured by the plurality of distance measuring units and determine whether a distance difference between each of the distances is greater than a threshold value.

18. The bonding machine with horizontal correction function as claimed in claim 1, wherein the pressing unit includes a pressing plate, a connecting plate and a plurality of fixing rods, the connecting plate is connected to the pressing plate through the plurality of fixing rods, and the pressing plate faces the carrying surface of the carrier, so as to press the first substrate and the second substrate on the carrier.

19. The bonding machine with horizontal correction function as claimed in claim 18, wherein the adjusting bar is connected to the connecting plate.

\* \* \* \* \*